(12) United States Patent
Li et al.

(10) Patent No.: US 7,784,531 B1
(45) Date of Patent: *Aug. 31, 2010

(54) NANOENGINEERED THERMAL MATERIALS BASED ON CARBON NANOTUBE ARRAY COMPOSITES

(75) Inventors: Jun Li, Sunnyvale, CA (US); Meyya Meyyappan, San Jose, CA (US); Carlos Dangelo, Los Gatos, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 342 days.

This patent is subject to a terminal disclaimer.

(21) Appl. No.: 11/900,131

(22) Filed: Aug. 27, 2007

Related U.S. Application Data

(63) Continuation of application No. 10/825,795, filed on Apr. 13, 2004, now Pat. No. 7,273,095.

(51) Int. Cl.
*F28F 13/00* (2006.01)
(52) U.S. Cl. ...................... 165/185; 165/80.3
(58) Field of Classification Search ............... 165/80.2, 165/80.3, 185; 361/704
See application file for complete search history.

(56) References Cited

U.S. PATENT DOCUMENTS 4,485,429 A  11/1984  Mittal
5,316,080 A  5/1994   Banks et al.
5,725,707 A  3/1998   Koon et al.
5,818,700 A  10/1998  Purinton
5,837,081 A  11/1998  Ting et al.
5,898,570 A  4/1999   Koon et al.
5,926,370 A  7/1999   Cromwell (Continued)

FOREIGN PATENT DOCUMENTS

EP   1329953 A1   8/2003

(Continued)

OTHER PUBLICATIONS

Banerjee, et al., "3-D Heterogeneous ICs: A Technology for the Next Decade and Beyond", *5th IEEE Workshop on Signal Propagation on Interconnects*, May 13-16, 2001, Venice, Italy.

(Continued)

*Primary Examiner*—Teresa J Walberg
(74) *Attorney, Agent, or Firm*—John F. Schipper; Robert M. Padilla

(57) ABSTRACT

A method for providing for thermal conduction using an array of carbon nanotubes (CNTs). An array of vertically oriented CNTs is grown on a substrate having high thermal conductivity, and interstitial regions between adjacent CNTs in the array are partly or wholly filled with a filler material having a high thermal conductivity so that at least one end of each CNT is exposed. The exposed end of each CNT is pressed against a surface of an object from which heat is to be removed. The CNT-filler composite adjacent to the substrate provides improved mechanical strength to anchor CNTs in place and also serves as a heat spreader to improve diffusion of heat flux from the smaller volume (CNTs) to a larger heat sink.

13 Claims, 7 Drawing Sheets

U.S. PATENT DOCUMENTS

| | | | |
|---|---|---|---|
| 5,965,267 | A | 10/1999 | Nolan et al. |
| 6,156,256 | A | 12/2000 | Kennel |
| 6,231,744 | B1 | 5/2001 | Ying et al. |
| 6,340,822 | B1 | 1/2002 | Brown et al. |
| 6,359,288 | B1 | 3/2002 | Ying et al. |
| 6,383,923 | B1 | 5/2002 | Brown et al. |
| 6,407,922 | B1 | 6/2002 | Eckblad et al. |
| 6,432,740 | B1 | 8/2002 | Chen |
| 6,452,274 | B1 | 9/2002 | Hasegawa et al. |
| 6,504,292 | B1 | 1/2003 | Choi et al. |
| 6,538,367 | B1 | 3/2003 | Choi et al. |
| 6,713,151 | B1 | 3/2004 | Dean et al. |
| 6,800,886 | B2 | 10/2004 | Awano |
| 6,803,260 | B2 | 10/2004 | Shin et al. |
| 6,831,017 | B1 | 12/2004 | Li et al. |
| 6,855,376 | B2 | 2/2005 | Hwang et al. |
| 6,856,016 | B2 | 2/2005 | Searls et al. |
| 6,864,571 | B2 | 3/2005 | Arik et al. |
| 6,891,724 | B2 * | 5/2005 | De Lorenzo et al. ........ 361/704 |
| 6,921,462 | B2 | 7/2005 | Montgomery et al. |
| 6,924,335 | B2 | 8/2005 | Fan et al. |
| 6,958,216 | B2 | 10/2005 | Kelley et al. |
| 6,962,823 | B2 | 11/2005 | Empedocles et al. |
| 6,965,513 | B2 * | 11/2005 | Montgomery et al. .. 361/679.46 |
| 6,989,325 | B2 | 1/2006 | Uang et al. |
| 7,273,095 | B2 * | 9/2007 | Li et al. ...................... 165/185 |
| 2002/0016073 | A1 * | 2/2002 | Kondo et al. ................ 438/691 |
| 2002/0090501 | A1 | 7/2002 | Tobita |
| 2002/0100581 | A1 | 8/2002 | Knowles et al. |
| 2002/0130407 | A1 | 9/2002 | Dahl et al. |
| 2002/0145194 | A1 | 10/2002 | O'Connor et al. |
| 2002/0163079 | A1 | 11/2002 | Awano |
| 2003/0111333 | A1 | 6/2003 | Montgomery et al. |
| 2003/0117770 | A1 | 6/2003 | Montgomery et al. |
| 2003/0189202 | A1 | 10/2003 | Li et al. |
| 2003/0231471 | A1 | 12/2003 | De Lorenzo et al. |
| 2004/0005736 | A1 | 1/2004 | Searls et al. |
| 2004/0013598 | A1 | 1/2004 | McElrath et al. |
| 2004/0053053 | A1 | 3/2004 | Jiang et al. |
| 2004/0099208 | A1 | 5/2004 | Kang et al. |
| 2004/0101468 | A1 | 5/2004 | Liu et al. |
| 2004/0126548 | A1 * | 7/2004 | Ueno et al. ................. 428/209 |
| 2004/0146560 | A1 | 7/2004 | Whiteford et al. |
| 2004/0150100 | A1 | 8/2004 | Dubin et al. |
| 2004/0150311 | A1 | 8/2004 | Jin |
| 2004/0152240 | A1 | 8/2004 | Dangelo |
| 2004/0182600 | A1 | 9/2004 | Kawabata et al. |
| 2004/0184241 | A1 | 9/2004 | De Lorenzo et al. |
| 2004/0191158 | A1 | 9/2004 | Liu et al. |
| 2004/0218362 | A1 | 11/2004 | Amaro et al. |
| 2004/0250753 | A1 | 12/2004 | Kang et al. |
| 2004/0261978 | A1 | 12/2004 | Zhan et al. |
| 2004/0261987 | A1 | 12/2004 | Zhang et al. |
| 2004/0265489 | A1 | 12/2004 | Dubin |
| 2004/0266063 | A1 | 12/2004 | Montgomery et al. |
| 2004/0266065 | A1 | 12/2004 | Zhang et al. |
| 2005/0006754 | A1 | 1/2005 | Arik et al. |
| 2005/0037204 | A1 | 2/2005 | Oslander et al. |
| 2005/0046017 | A1 | 3/2005 | Dangelo |
| 2005/0061496 | A1 | 3/2005 | Matabayas |
| 2005/0067693 | A1 | 3/2005 | Nihei et al. |
| 2005/0092464 | A1 | 5/2005 | Leu et al. |
| 2005/0116336 | A1 | 6/2005 | Chopra et al. |
| 2005/0136248 | A1 | 6/2005 | Leu et al. |
| 2005/0139642 | A1 | 6/2005 | Koning et al. |
| 2005/0139991 | A1 | 6/2005 | White et al. |
| 2005/0150887 | A1 | 7/2005 | Taya et al. |
| 2005/0167647 | A1 | 8/2005 | Huang et al. |
| 2005/0224220 | A1 | 10/2005 | Li et al. |
| 2005/0238810 | A1 | 10/2005 | Scaringe et al. |
| 2005/0260412 | A1 | 11/2005 | Gardner |
| 2005/0269726 | A1 | 12/2005 | Matabayas, Jr. |

FOREIGN PATENT DOCUMENTS

| | | |
|---|---|---|
| WO | WO 03/054958 A1 | 7/2003 |
| WO | WO 03/072679 A1 | 9/2003 |
| WO | WO 03/107419 A1 | 12/2003 |

OTHER PUBLICATIONS

Berber, et al., Unusually High Thermal Conductivity of Carbon Nanotubes, Physical Review Letters, May 15, 2000, 4613-4616, vol. 84, No. 20.

Cassell, "Directed Growth of Free-Standing Single-Walled Carbon Nanotubes", *J Am.. Chemical Society*, 1999, pp. 7975-7976, 121.

Chiang, "A New Analytical Thermal Model for Multilevel ULSI Interconnects Incorporating Via Effect", Center for Integrated Systems, Stanford University (no date given).

Chiang, et al., "Effect of Via Separation and Low-k Dielectric Materials on the Thermal Characteristics of Cu Interconnects", *IEDM 2000* (no date).

Chuang, et al., "Inprovement of Thermal Contact Resistance by Carbon Nanotubes and Nanofibers," Journal of Nanoscience and Nanotechnology (2004), pp. 964-967, vol. 4, No. 8, American Scientific Publishers.

Cui, et al., "Doping and Electrical Transport in Silicon Nanowires", *Journal of Physical Chemistry*, Jun. 8, 2000, pp. 5213-5216, vol. 104, No. 22.

De Pablo, "A simple, reliable technique for making electrical contact to multiwalled carbon nanotubes", *Applied Physics Letters*, Jan. 11, 1999, pp. 323-325, vol. 74, No. 2.

Delzeit, et al., "Growth of carbon nanotubes by thermal and plasma chemical vapour deposition processes and applications in microscopy", *Nanotechnology*, May 23, 2002, pp. 280-284, vol. 13.

Delzeit, et al., "Growth of multiwall carbon nanotubes in an inductively coupled plasma reactor", *Journal of Applied Physics*, May 1, 2002, pp. 6027-6033, vol. 91, No. 9.

Delzeit, et al, "Directed Growth of Single-Walled Carbon Nanotues" International Journal of Nanoscience, 2002, 197-204, vol. 1, Nos. 3 & 4, World Scientific Publishing Co.

Goodson, et al., "Improved Heat Sinking for Laser-Diode Arrays Using Microchannels in CVD Diamond", *IEE Transactions on Components, Packaging, and Manufacturing Technology*, Part B, Advanced Packaging, pp. 104-109, vol. 20, Issue 1, Feb. 1997.

Hone, et al., "Thermoelectric Power of Single-Walled Carbon Nanotubes", *Physical Review Letters*, pp. 1042-1045, vol. 80, No. 5, Feb. 2, 1998.

Huang, et al. "Growth of highly oriented carbon nanotubes by plasma-enhanced hot filament chemical vapor deposition", *Applied Physics Letters*, Dec. 28, 1998, pp. 3845-3847, vol. 73, No. 26.

Hwang, et al, "Simulations and Experiments of Etching of Silicon in HBr Plasmas for High Aspect Ratio Features," J. Vac. Sci. Technol., 2002, 2199, vol. B 20, Amer Vac Soc.

*International Semiconductor Road Map* (ITRS-2001), Section on Interconnect, http://public/itrs.net/files/20011TRS/interconnect.pdf.

Kim, et al., "Growth characteristics of carbon nanotubes via aluminum nanopore template on Si substrate using PECVD", *Elsevier Thin Solid Films*, 2003, pp. 312-317, vol. 425.

Kong, et al., "Systhesis of individual single-walled carbon nanotubes on patterned silicon wafers", *Nature*, Oct. 29, 1998, pp. 878-881, vol. 39.

Kurabayashi, et al., "Precision Measurement and Mapping of Die-Attach Thermal Resistance", *IEEE Transactions on Components, Packaging, and Manufacturing Technology*, Part A: Advanced Packaging, Sep. 1998. pp. 506-514, vol. 21, Issue 3.

Li, et al., "Electronic properties of multiwalled carbon nanotubes in an embedded vertical array", *Applied Physics Letters*, Jul. 29, 2002, pp. 910-912, vol. 81, No. 5.

Li, et al., Bottom Up Approach for Carbon Nanotube Interconnects, Applied Phys. Letters, Apr. 18, 2003, 2491-2493, vol. 82, No. 15, American Institute of Physics.

Liu, et al., "Controlled deposition of individual single-walled carbon nanotubes on chemically functionalized templates", *Chemical Physics Letters*, Apr. 2, 1999, pp. 125-129, 303.

McEuen, et al., "Single-Walled Carbon Nanotube Electronics", *IEEE Transactions on Nanotechnology*, Mar. 2002, pp. 78-85, vol. 1, No. 1.

Meyyappan, et al., "Carbon nanotube growth by PECVD: a review", *Plasma Sources Science and Technology*, Apr. 2, 2003, pp. 205-216, vol. 12.

Ren, et al., "Synthesis of Large Arrays of Well-Aligned Carbon Nanotubes on Glass", *Science*, Nov. 6, 1998, pp. 1105-1107, vol. 282.

Shi, "A Microdevice for Measuring Thermophysical Properties of Nanowires and Nanotubes", *2001 ASME International Mechanical Engineering Congress and Exposition*, Nov. 11-16, 2001, pp. 359-362.

Shi, "Scanning thermal microscopy of carbon nanotubes using batch-fabricated probes", *Applied Physics Letters*, Dec. 25, 2000, pp. 4295-4297, vol. 77, No. 26.

Stevens, "Improved fabrication approach for carbon nanotube probe devices", *Applied Physics Letters*, Nov. 20, 2000, pp. 3453-3455, vol. 77, No. 21.

Sun, et al., "Theoretical modeling of thermoelectricity in Bi nanowires", *Applied Physics Letters*, Jun. 28, 1999, pp. 4005-4007, vol. 74, No. 26.

Tu et al., Growth of Aligned Carbon Nanotubes with Controlled Site Density, Applied Phys. Letters, May 27, 2002, 4018-4020, vol. 80, No. 21, American Institute of Physics.

Ural, et al, "Electric-Field-Aligned Growth of Single-Walled Carbon Nanotubes on Surfaces," Applied Physics Letters, Oct. 28, 2002, 3464-3466, vol. 81, No. 18, AIP.

Viswanath, et al., "Thermal Performance Challenges from Silicon to Systems," Intel Technology Journal Q3 Microprocessor Packaging, Aug. 2000, vol. 4, Issue 3.

Wei, et al., "Reliability and Current Carrying Capacity of Carbon Nanotubes," Applied Physics Letters, Aug. 20, 2001, 1172-1174, vol. 79, No. 8, AIP.

Yakobson, et al., "Fullerene Nanotubes: $C_{1,000,000}$ and Beyond", *American Scientist online*, http://www.americanscientist.org/template/AssetDetail/assetid/2870?fulltext=true&print=yes.

Zhang, Wei De, et al., "Synthesis of vertically aligned carbon nanotubes films on silicon wafers by pyrolysis of ethylenediamine", *Elsevier, Thin Solid Films*, 2002, pp. 120-125, 422.

Zhang, et al., "Electric-field-directed growth of aligned single-walled carbon nanotubes", *Applied Physics Letters*, Nov. 5, 2001, pp. 3155-3157 vol. 79, No. 19.

Zhang, et al., "Formation of Metal Nanowires on Suspended Single-Walled Carbon Nanotubes", Appl. Phys. Lett, 2000, p. 3015, vol. 77(19).

Zhou, et al., "Thermomechanical Diagnostics of FLIP-CHIP/BGA Structures Using Phase-Shifting Electronic Speckle Pattern Interferometry", *EEP, Advances in Electronic Packaging*, ASME, 1999, pp. 1875-1880, vol. 26-2.

* cited by examiner

NANOENGINEERED THERMAL MATERIALS BASED ON CARBON NANOTUBE ARRAY COMPOSITES

CROSS REFERENCE TO RELATED APPLICATIONS

This application is a continuation of prior filed application Ser. No. 10/825,795, filed 13 Apr. 2004.

ORIGIN OF THE INVENTION

The invention described herein was made by employees of the United States Government and may be manufactured and used by or for the Government for governmental purposes without the payment of any royalties thereon or therefor.

TECHNICAL FIELD

The present invention provides thermal conductors for small components and devices, using carbon nanotube arrays.

BACKGROUND OF THE INVENTION

State-of-the-art integrated circuits (ICs) for microprocessors routinely dissipate power densities on the order of 50 Watts/cm$^2$. This large power is due to the localized heating of ICs operating at high frequencies, and must be managed for future high-frequency microelectronic applications. As the size of components and devices for ICs and other appliances becomes smaller, it becomes more difficult to provide heat dissipation and transport for such components and devices. A thermal conductor for a macro size thermal conductor is generally inadequate for use with a micro size component or device, in part due to scaling problems.

One consequence of increased component density in, and compactness of, ICs manifests itself in the form of locally high power consumption. An alarming rise in power density with respect to each advancing technology generation has been observed in mainstream microprocessor technologies. The need for addressing this problem is imperative for next-generation IC packaging technology. One potential solution is to find new packaging materials that exhibit high thermal conductivity and that can transfer heat from a local hot spot to a larger heat sink.

The cooling of an object by attaching it to a cold reservoir is normally limited by the heat transfer rate across the interface. Except for objects with atomically flat surfaces, practical objects normally have only a very small portion of surface in contact with other solid surfaces. Eutectic bonding materials or thermal conducting pastes/films are normally applied at the interface to increase the contact area. However, the thermal conductivities of these eutectic bonding materials are normally orders of magnitude lower than those of solid materials such as Cu and Si. The interface thus remains the bottleneck for heat dissipation. Metal film can be used to improve the thermal conductivity but is only applicable for high pressure loading.

What is needed is a compliant thermal interface material that efficiently and promptly dissipates or conducts heat from a micro size component or device, preferably down to nanometer scale systems, to a heat sink with a heat transfer rate that is comparable to rates for macro size components and devices. Preferably, the thermal conductor should be reusable and should work with any surface, rough or smooth.

SUMMARY OF THE INVENTION

These needs are met by the invention, which uses an embedded carbon nanotube array to provide one or more high performance thermal conductors for applications that require large heat dissipation. This approach also improves the mechanical strength of carbon nanotubes (CNTs) so that the CNT array can remain stable and can make good contact to the surface of objects that generate large amount of heat, through use of reversible buckling and bending of exposed portions of the CNTs. The extremely high thermal conductivity along a carbon nanotube axis is employed to transfer heat away from hot spots in a component or device. Copper and other high thermal conductivity materials are deposited to fill interstitial regions or gaps in a first part of a CNT array. This composite structure provides mechanical strength to maintain the CNTs in position and also serves as an efficient heat transfer material to improve diffusion of heat flux from an individual CNT to a larger surrounding volume.

The innovation uses vertically oriented CNT arrays to increase the effective contact area (particularly for a rough surface) while providing an extremely large thermal conductivity along a CNT axis and across the interface. The fabrication involves four steps: (1) substantially vertically aligned CNT arrays with a preferred length of from 1 to 50 microns are grown on a solid substrate (serving as a heat sink) that has good thermal conductivity, such as Si wafers and metal blocks/films; (2) a first portion of, or all of, interstitial spaces between adjacent CNTs are filled with highly thermally conductive materials such as Cu, Ag, Au, Pt or doped Si by chemical vapor deposition (CVD), physical vapor deposition (PVD), plasma deposition, ion sputtering, electrochemical deposition, or casting from liquid phase; (3) filler materials are removed from a second portion of the interstitial spaces by mechanical polishing (MP), chemical mechanical polishing (CMP), wet chemical etching, electrochemical etching, or dry plasma etching so that the top portion of the CNT array is exposed, with the bottom part remaining embedded in the filler materials; and (4) the embedded CNT array is applied against an object that is to be cooled. CNTs can reversibly buckle or bend one by one under low loading pressure so that a CNT can make maximum contact with the object to be cooled, even an object with a very rough surface.

Heat can be effectively transferred from the contacting spots along the tube axis to the filler materials as well as the substrates. The filler materials plays two critical roles: (a) improving the mechanical stability, and (b) maximizing the thermal conductivity. Choosing highly thermal conductive materials as the filler matrix maximizes the heat transfer from the contact spots to the substrate (i.e. the heat sink or cooling reservoir). An embedded CNT array can be reused without damage or compromise of its heat transport characteristics, in contrast to an approach that relies upon eutectic bonding.

The invention improves the mechanical stability of a CNT array by anchoring the lower portion of the array in a solid matrix so that the array retains the integrity when pressed against the heated object during mounting processes. The reversible buckling and bending properties of a CNT array ensures a maximum physical contact under a low loading pressure with the object surface, whether the surface is atomically flat or very rough.

For a discrete multiwall carbon nanotube (MWCNT), the thermal conductivity is expected to surpass 3000 Watts (meter)$^{-1}$K$^{-1}$ along the tube axis, according to P. Kim et al, Phys. Rev. Lett., vol. 87 (2001) 215502-1. Through the use of DC-biased, plasma-enhanced chemical vapor deposition (PECVD), as demonstrated by B. A. Cruden et al, Jour. Appl. Phys., vol. 94 (2003) 4070, one can fabricate vertically aligned MWCNT arrays (sometimes referred to as carbon nanofiber arrays) on silicon wafers of thickness ~500 μm and demonstrate their possible application as a heat-sink device, conducting large amounts of heat away from a localized area, such as in critical "hot spots" in ICs.

This innovation is an outgrowth of an earlier NASA patent application (NASA Ref. No. ARC-15042-1) which uses a CNT array as an electrical interconnect material embedded in an $SiO_2$ matrix. Here, a highly thermal conductive material, such as Cu, Ag, and/or Si, replaces $SiO_2$, used to control electrical conduction in the earlier innovation.

BRIEF DESCRIPTION OF TH DRAWINGS

FIG. 1 illustrates a CNT array thermal conduction system constructed according to the invention.

FIG. 2 schematically illustrates use of the invention.

DESCRIPTION OF BEST MODES OF THE INVENTION

Figure 1:
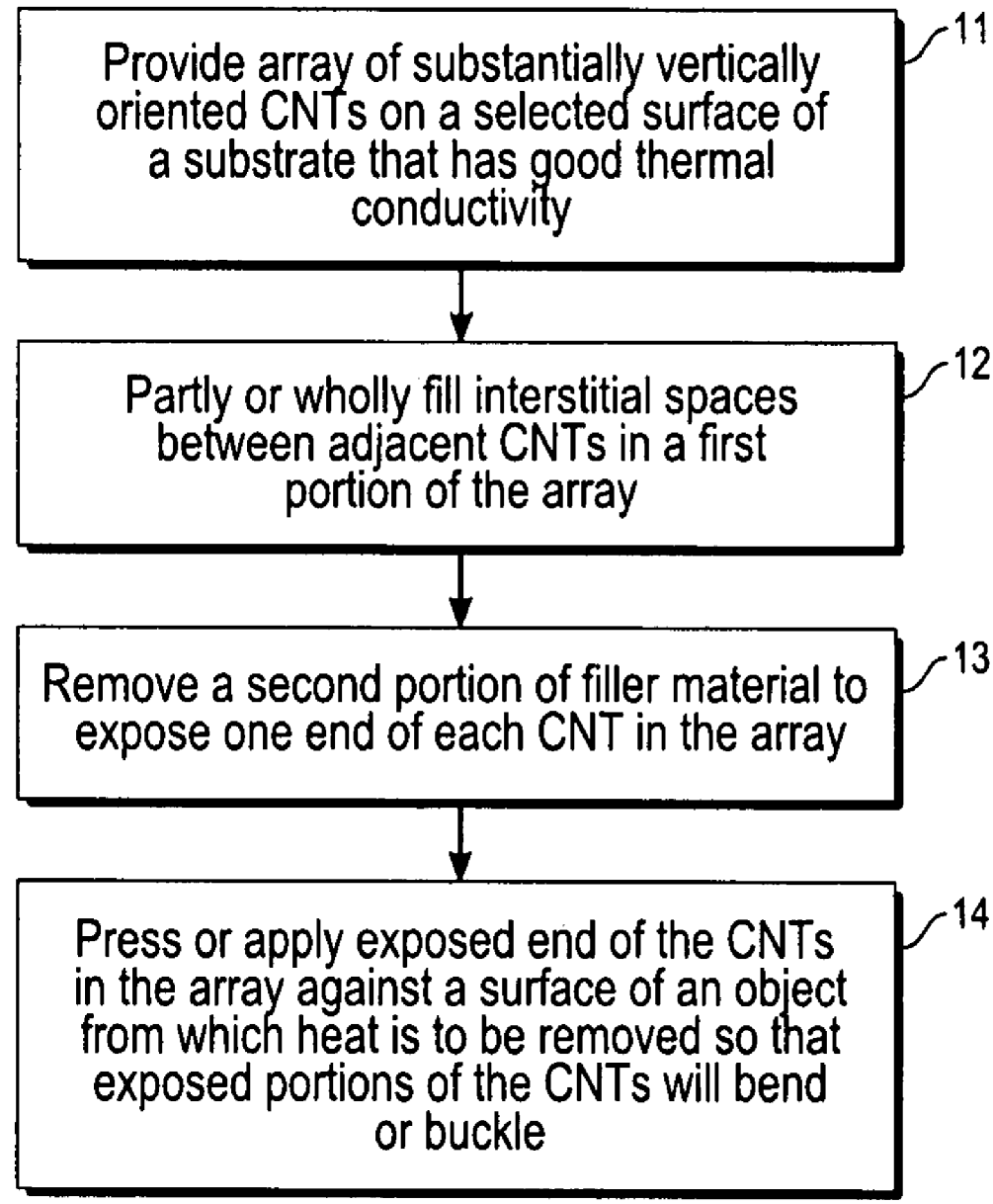

FIG. 1 illustrates a procedure for practicing an embodiment of the invention. In step 11, an array of substantially vertically oriented CNTs is grown on a selected surface of a substrate that has good thermal conductivity. The substrate may be a metal-doped silicide, a diamond film, or a metallic substance having a maximum electrical or thermal conductivity. Whether the array is patterned or not, it is preferable to provide a thin CNT catalyst layer (e.g., Ni, Fe, Co, Pd or Al or a combination thereof) having a layer thickness of 2-50 nanometers (nm), or more if desired. When the CNT is grown in an electrical field oriented substantially perpendicular to the selected substrate surface, the CNTs can be grown in greater lengths (1-50 μm or more) in a direction substantially parallel to the electrical field direction.

In step 12, interstitial spaces between adjacent CNTs are partly or fully filled with a selected filler material that is preferably a good thermal conductor (e.g., Cu, Ag, Au or metal-doped silicon), in order to augment the transport of heat, using chemical vapor deposition (CVD), physical vapor deposition (PVD), plasma deposition, ion sputtering, electrochemical deposition, or casting from liquid phase. Depending upon the density of CNTs in the array and the filler material, the thermal conductivity of the system is estimated to be in a range of 100-3000 Watts/(meter)-K, which is comparable to the thermal conductivity of oriented graphite.

In step 13, a top portion of the filler material is removed by mechanical polishing (MP), chemical mechanical polishing (CMP), wet chemical etching, electrochemical etching, dry plasma etching, or a combination thereof so that the top portion of the CNT array is exposed.

In step 14 (optional), the thermal conduction system provided by the steps 11, 12 and 13 is pressed or otherwise applied to a surface (atomically smooth, rough or somewhere in between) of an object from which heat is to be removed so that the exposed portions of the CNTs will bend or buckle.

Figure 2:
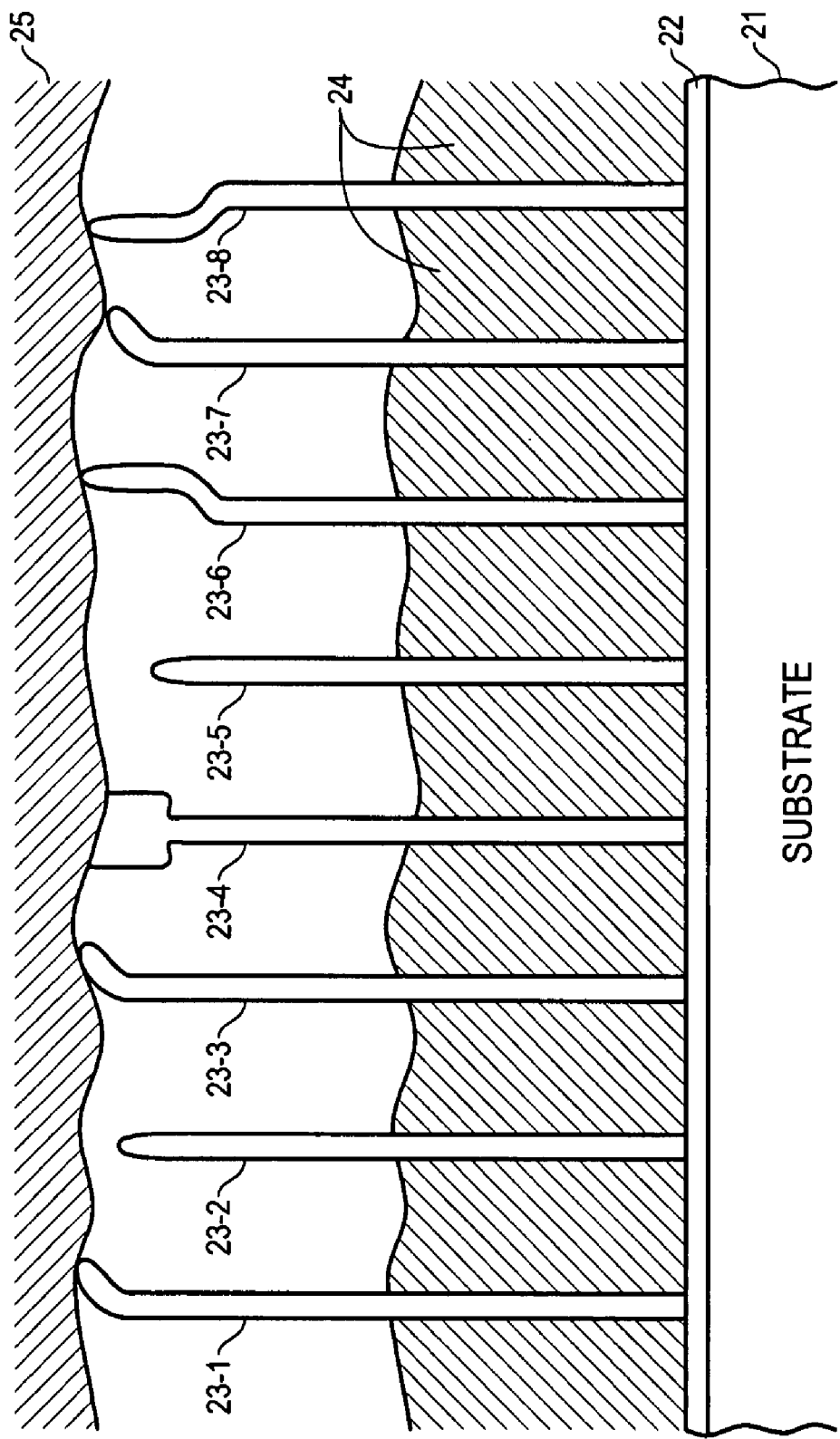

FIG. 2 schematically illustrates use of the system produced by the procedure of FIG. 1 to remove heat from an object 25. An array of CNTs 23-$i$ ($i=1, \ldots, I$ ($I=8$ in FIG. 2) is grown or otherwise provided on a selected surface of a substrate 21 having an optional catalyst layer 22. A layer of filler material 24, having a depth that allows exposure of an upper portion of each CNT 23-$i$, is provided, for mechanical strengthening of the CNTs and for improved diffusion of heat that initially travels only along the CNTs (from the object 25). The CNTs 23-$i$ are pressed against a surface of an object 25, from which heat is to be removed, so that many or all of the CNTs make contact with the (rough) object surface and either bend (23-1, 23-3 and 23-7) or buckle (23-4, 23-6 and 24-8) in order to improve heat transport from the object.

Figure 3A:
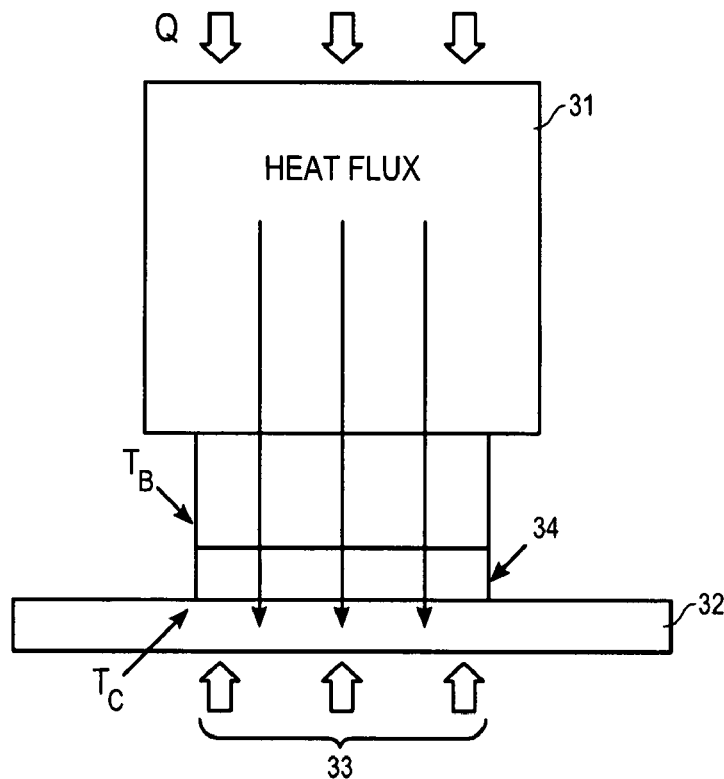
FIGS. 3A and 3B illustrate apparatus used for thermal resistance measurements.

A measurement apparatus, illustrated in FIG. 3A, including two copper blocks, 31 and 32, four resistive cartridge heaters (not shown) embedded in the upper block, and a cooling bath 33, is used to measure the thermal resistance of a given material. The upper copper block 31 is preferably surrounded by insulation (not shown) to minimize heat loss to the ambient, with the exception of the one square inch section designed to contact the material 34 to be measured. The clamping pressure on the sample is controlled by pneumatically manipulating the upper block. Heat is delivered to the system by applying a constant power to the cartridge heaters. The steady state temperature difference ($\Delta T = T_B - T_C$) between the two blocks, 31 and 32, with the intervening sample 34, was measured. From these data, the thermal resistance R of the sample is calculated, as in Eq. (1), where Q is the total power (in Watts), A is the sample cross-sectional area, $C_L$ is the constant heat transfer coefficient and $T_B$, $T_C$, and $T_{amb}$ represent the temperature of the upper block 31, the chilled lower block 32 ($T_C=20°$ C.), and the ambient environment, respectively. The heat transfer coefficient $C_L$ is used to estimate the heat loss to the ambient environment in this measurement configuration and is determined by placing a thick insulator between the two blocks and measuring the steady state $\Delta T$ at a variety of applied powers. This analysis yields a constant heat transfer coefficient of $C_L=0.0939$ Watts/K, which is factored into the final determination of the measured thermal resistance R. This coefficient $C_L$ represents the heat power lost (in Watts) per degree Kelvin to the ambient environment.

$$R = \frac{A(T_B - T_C)}{Q - C_L(T_B - T_{amb})} \quad (1)$$

The dominant thermal resistance mechanism in this measurement configuration is that of the contact interfaces between the sample 34 and the copper blocks, 31 and 32. To minimize this contact resistance, two steps were taken: (1) polishing both copper blocks, 31 and 32, to reduce the effect of surface roughness and (2) making use of a high thermally conductive, conformal material, Microfaze A6 (available from AOS Thermal Compounds, LLC, New Jersey) to reduce contact resistance on the backside of a silicon wafer, the substrate on which the investigated films were fabricated.

Sample Preparation

Figure 4B:
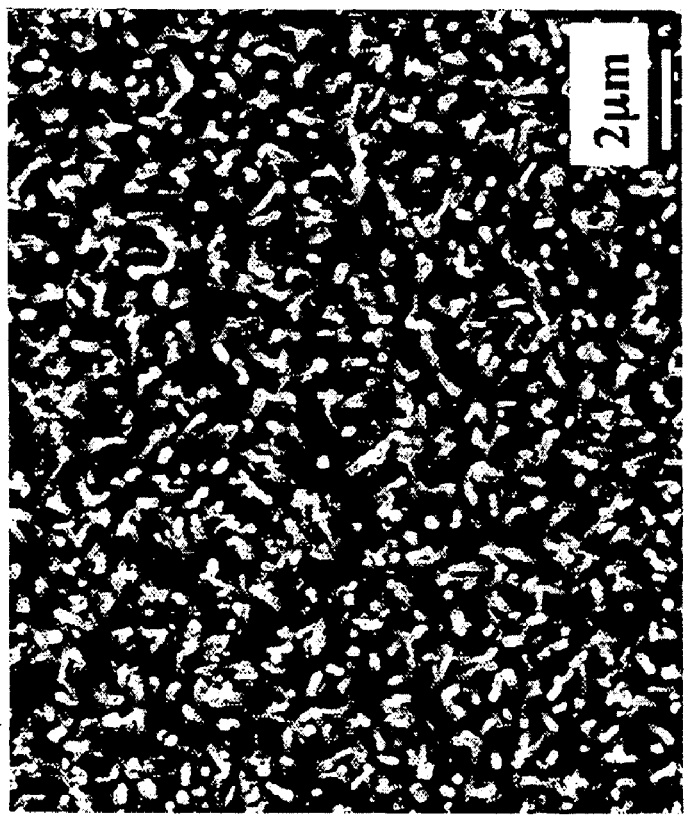
FIGS. 4A and 4B are scanning electron microscope (SEM) cross sectional and top-down microphotographs, respectively, of an as-grown multiwall carbon nanotube array.
Figure 4A:
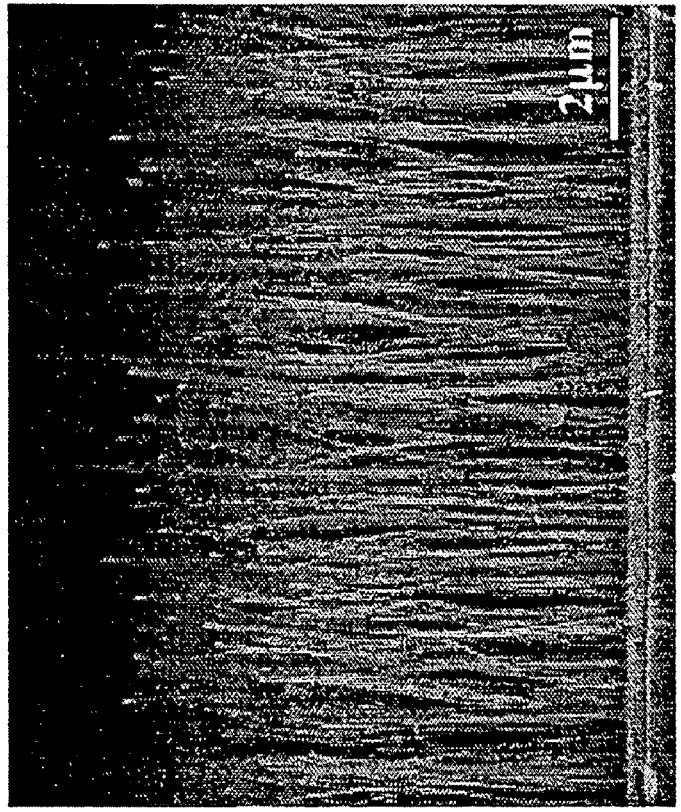

Carbon nanotubes were synthesized using the procedure and reactor conditions reported by B. A. Cruden et al, op cit. The resulting as-grown tubes are shown in cross section and top views in FIGS. 4A and 4B, respectively. Using scanning electron microscope (SEM) data, we estimate the length of the MWCNTs to be about 7.5 μm, with a possible range of 1-50 μm.

Following nanotube synthesis, a high thermal conductivity metal-like substance (e.g., Cu, Ag, Au, Pt or Pd) between individual MWCNTs (also referred to as nanotube trenches) was deposited through electrodeposition, using a three-electrode setup with a one $cm^2$ MWCNT array as the working electrode, a Saturated Calomel Electrode (SCE) as the reference electrode, and a one square inch platinum foil as the counter electrode (CE), set in parallel with the MWCNT sample. Both the Cu substrate and the MWCNTs serve as electrodes during the electrodeposition.

Figure 5B:
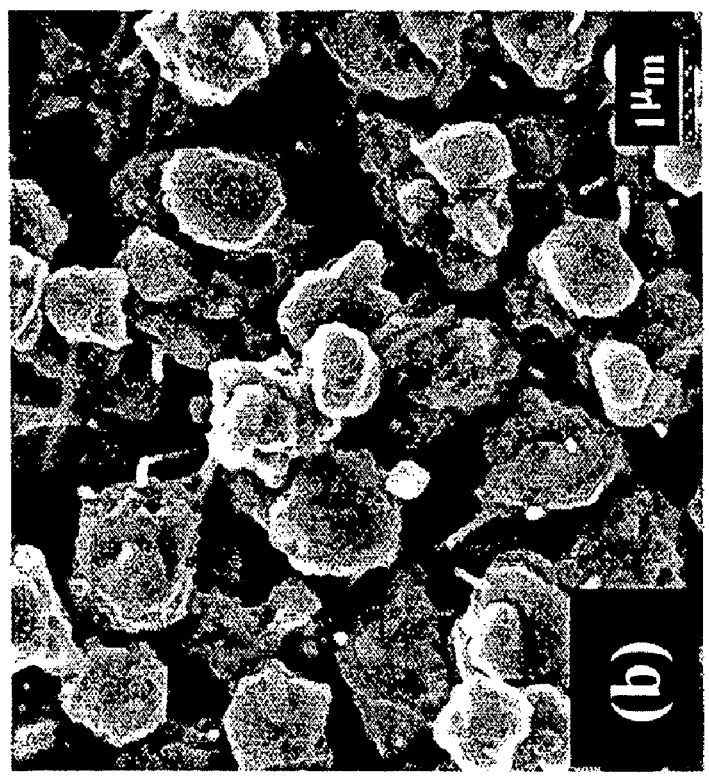
FIGS. 5A and 5B are SEM cross sectional and top-down photomicrographs, respectively, of a CNT-Cu composite film.
Figure 5A:
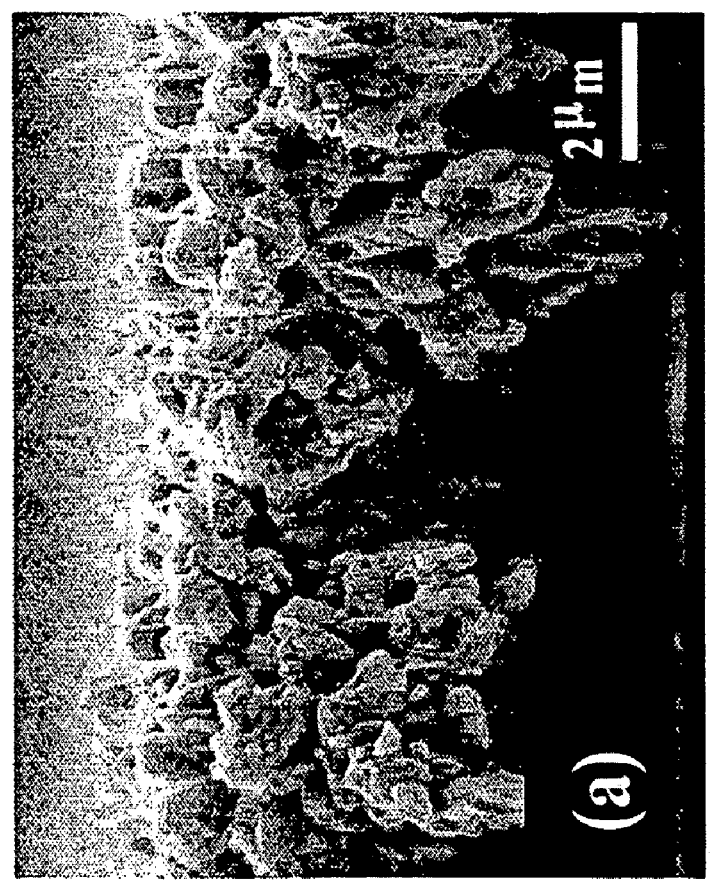

Various additives are optionally added to the solution to achieve optimum gap filling into the high-aspect-ratio, forest-like MWCNT arrays. The recipe of the electrolyte solution used in this study is based on the methodology reported for deep-trench filling of Cu interconnects for damascene processes, as reported by K. Kondo et al, Jour. Electroanalytical Chem., vol. 559 (2003) 137. We begin with a stock solution comprised of copper sulfate ($CuSO_4 \cdot 5H_2O$), sulfuric acid ($H_2SO_4$), and sodium chloride (NaCl). Polyethylene glycol (PEG) is added to inhibit copper deposition at the tips of the nanotubes when in the presence of $Cl^-$ ions. Janus Green B (JGB) is also added for its deposition inhibiting properties. Bis(3-sulfopropyl) disulfide (SPS) is included to increase local current density at the bottom of the nanotube trenches, thus enhancing the superfilling of high-aspect ratio trenches. The final solution, including concentrations used in the bath, is shown in Table I. Typically, the Cu was deposited at −0.20 to −0.30V (vs. SCE) at a deposition rate of about 430 nm/min. The resulting CNT-Cu composite material is shown in FIGS. 5A and 5B.

Figure 3B:
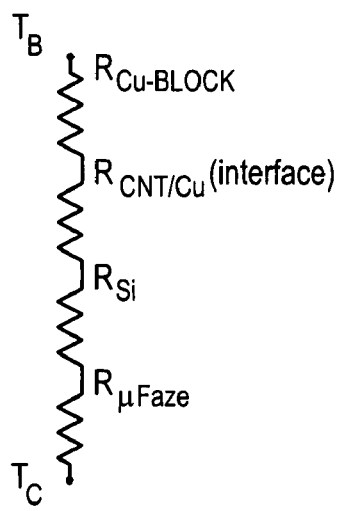
Figure 3C:
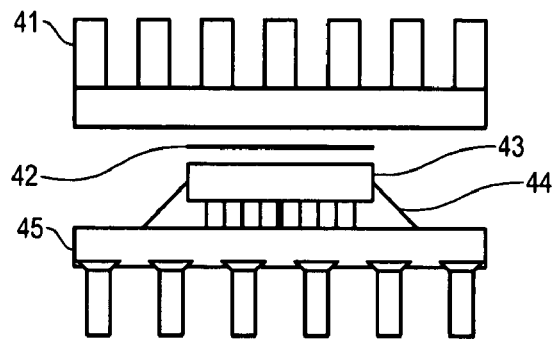
FIG. 3C illustrates a packaging architecture used in the prior art.

FIG. 3C illustrates typical packaging architecture, as discussed by R. Viswanath et al, Intel Tech. Jour Q3 (2000), including a heat sink (fins and heat spreader) 41 are contiguous to a thin interface (phase change film, grease, etc.) 42, which is contiguous to a thin silicon layer 43. A heat delivery array 45 contacts the silicon array back surface 43 through a conductive gel or epoxy 44. This system requires use of greases, phase change films, thermally conductive gels and/or special epoxies and is quite complex.

TABLE I

Electrochemical bath composition for copper deposition

| Bath Chemical/Additive (concentration unit) | Concentration |
|---|---|
| $CuSO_4 \cdot 5H_2O$ (mol/L) | 0.6 |
| $H_2SO_4$ (mol/L) | 1.85 |
| NaCl (ppm) | 100 |
| PEG, molar mass: 8000 (ppm) | 400 |
| JGB (ppm) | 10 |
| SPS (ppm) | 10 |

Results and Discussion

To summarize the structure used, FIG. 3B illustrates the equivalent thermal resistance model for the CNT-Cu composite sample. The resistance of the CNT-Cu composite can be obtained by de-embedding the thermal resistance contribution of the copper block ($R_{Cu-block}$), silicon wafer ($R_{Si}$), and the Microfaze material ($R_{\mu Faze}$). The thermal resistance of the copper block, $R_{Cu-block}$, must be taken into account due to the placement of the thermocouple (approximately one inch from the copper block surface). From bulk calculations, $R_{Cu-block}$ for this configuration can be estimated as 0.95 $cm^2$K/Watt. To summarize, one can determine the resistance of the CNT/Cu composite film by Eq. (2).

$$R_{CNT/Cu} = R_{total} - R_{Cu-block} - R_{Si} - R_{\mu Faze}. \qquad (2)$$

$R_{\mu Faze}$ is determined using two control measurements. The first measurement involves measuring the thermal resistance of a piece of silicon with Microfaze on the backside of the wafer, resulting in $R_{control} = R_{Cu-block} + R_{block-Si} + R_{\mu Faze}$, where $R_{block-Si}$ is the interface resistance between the copper block and silicon wafer. The second resistance measurement involves a piece of double-sided polished silicon, resulting in $R_{control,2} = 2R_{block-Si} + R_{Si}$. Assuming that both Si—Cu interfaces in the second control measurement are similar, one can divide this value in half and use the simple relation in Eq. (3).

$$R_{\mu Faze} = R_{control,1} - (R_{control,2} - R_{Si})/2 - R_{Cu-block}. \qquad (3)$$

Figure 6A:
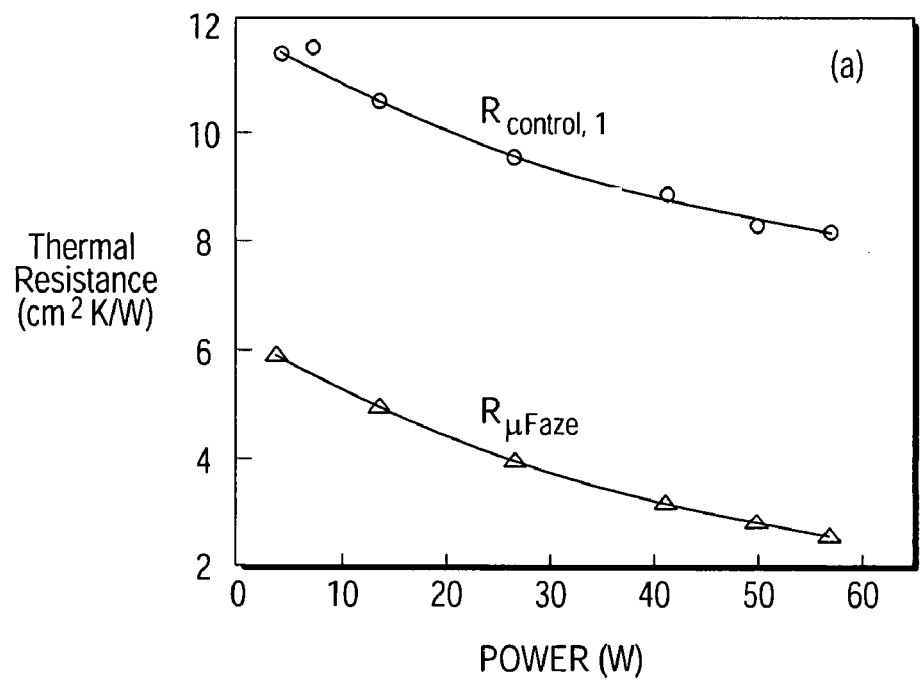
FIGS. 6A and 6B are graphical views of thermal resistance versus electrical power measurements for a first control sample and Microfaze (FIG. 6A) and for a CNT-only film and for two different CNT-Cu films (FIG. 6B).

The intrinsic silicon contribution ($R_{Si}$) to the thermal resistance in Eqs. (2) and (3) can be neglected. For the 500 μm thick silicon wafer used in this study, the intrinsic silicon thermal resistance can be calculated as 0.034 $cm^2$K/Watt, which is two orders of magnitude less than the final measured values of the CNT-Cu sample, and is thus negligible. One caveat to this analysis is in regards to the thermal resistance of Microfaze with respect to the amount of power applied to the upper block. The thermal resistance of the first control sample decreases approximately exponentially with increasing power, corresponding to different temperature gradients, but can be corrected for in the final analysis as will be demonstrated. The double-sided, polished silicon sample shows no power dependence and exhibits a substantially constant resistance of R=11.10 $cm^2$K/Watt, resulting in 5.55 $cm^2$K/Watt per silicon interface. Subtracting the silicon resistance, which is constant with respect to applied power, one can also determine $R_{\mu Faze}$ at different powers. The power dependence of the Microfaze is illustrated in FIG. 6A.

Figure 6B:
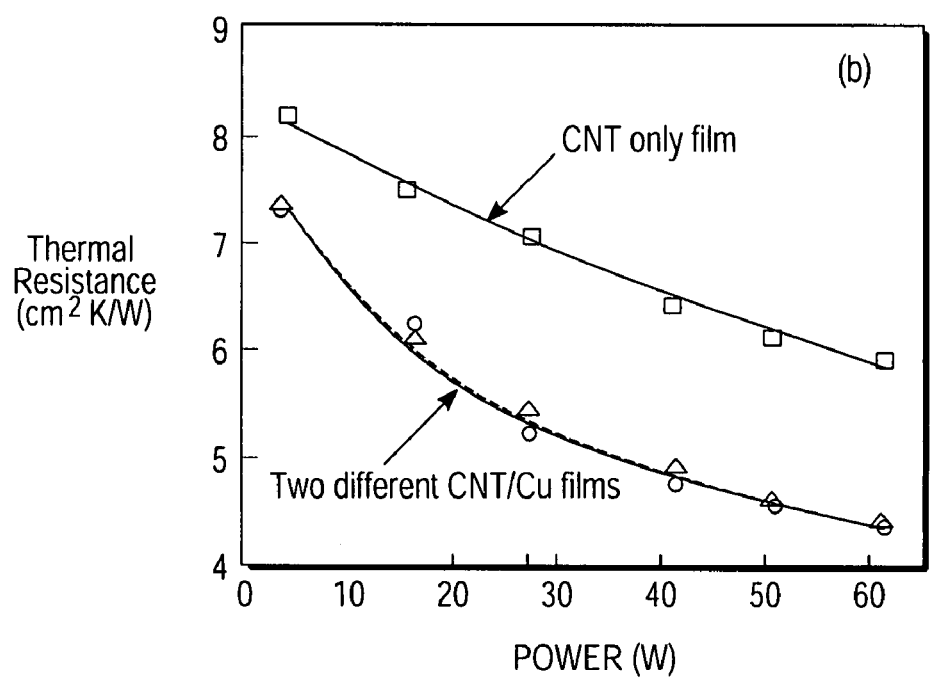

Now that the power dependence of the Microfaze material is quantified, one proceeds with the analysis of the CNT/Si/Microfaze and CNT-Cu/Si/Microfaze stacks. From the previous discussion, one expects these samples to exhibit the same power dependence, which indeed is the case and is clearly seen in FIG. 6B. Combining the power dependence with the measurements in FIG. 6B we summarize the values of measured thermal resistance in Table II. All measurements were performed at similar clamp pressures, 6.8 psi. Errors contributing to the standard deviation in the measurements can be attributed primarily to two factors: (1) variations in contact area due to varying CNT length distribution (see FIG. 4A); and (2) variations in measurement of total power, ΔT, and ambient temperature loss. However, even at the upper bounds of the measured thermal resistance values for the CNT-Cu composite films, this worst-case scenario represents values that are on the order of the thermal budgets for a variety of commercial microprocessor systems.

TABLE II

Thermal Resistance Measurement Summary

| Material | Thermal Resistance (cm$^2$K/W) ± STDEV |
|---|---|
| CNT film | 2.30 ± 0.33 |
| CNT-Cu composite film (#1) | 0.84 ± 0.22 |
| CNT-Cu composite film (#2) | 0.92 ± 0.13 |
| Bare double-sided silicon | 11.10 ± 0.65 |

Figures 7A, 7B:
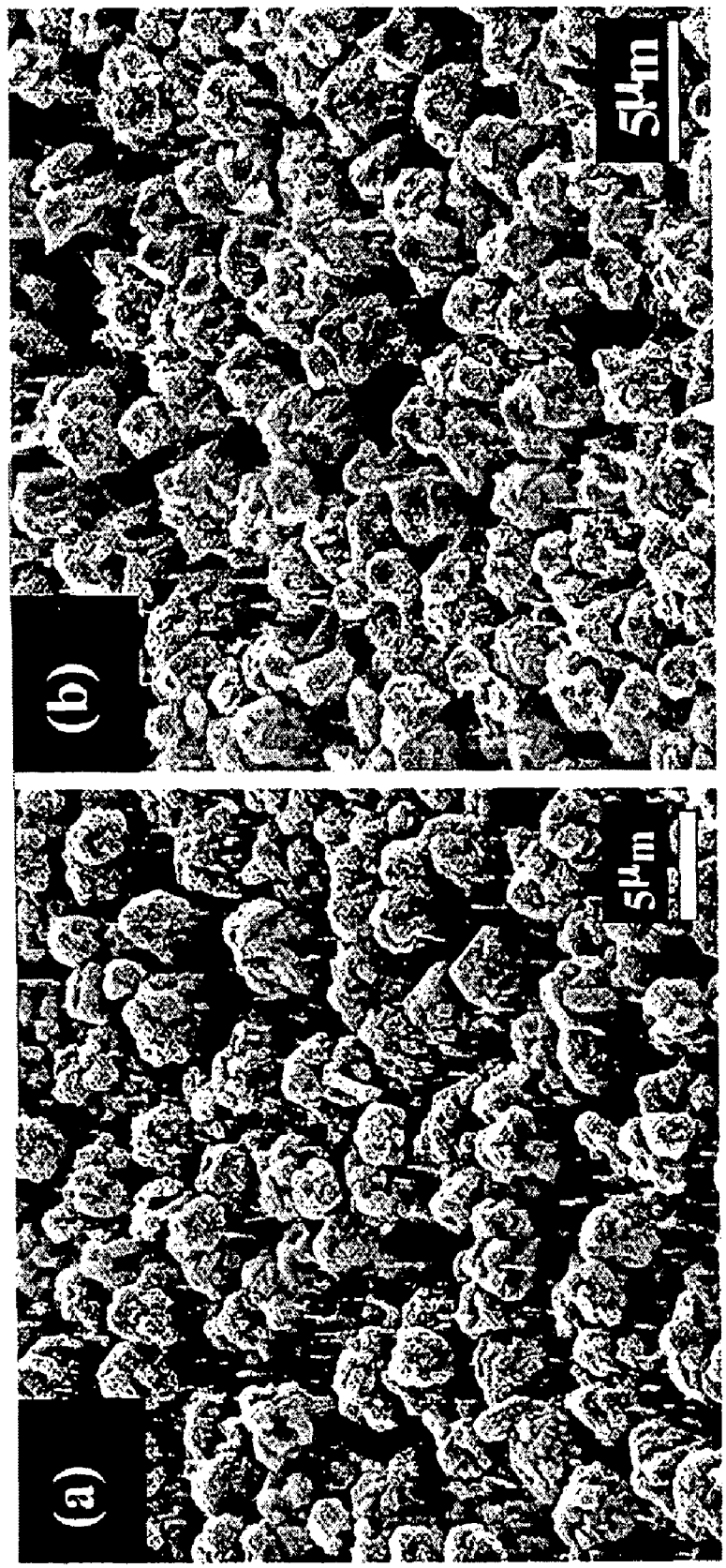
FIGS. 7A and 7B are SEM photomicrographs of a CNT-Cu film, taken before and after compressive thermal resistance measurements, respectively.

The Cu deposited in the MWCNT array used in this study was not a solid film. Instead, the Cu forms a porous film with ~70% Cu and CNTs and ~30% voids. This configuration increases the mechanical strength so that the sample can be repeatedly and reproducibly measured under different clamping pressures. In addition, this configuration provides spaces so that the composite film can be deformed to make maximal contact with the hot surface. However, studies conducted on the buckling force of discrete MWCNTs, by H Dai et al, Nature, vol. 384 (1996) 147, by H. Dai et al, Appl. Phys. Lett. Vol. 73 (1998) 1508, and by J. Li et al (Surf. And Interf. Analysis, vol. 28 (1999) 8, demonstrate the tremendous amount of force per unit cross sectional area that these structures can withstand. Based on this analysis, we speculate that most nanotubes do not buckle under the force applied in this preliminary study, which is roughly two orders of magnitude less than the calculated CNT buckling force. SEM characterization before and after the thermal resistance measurement (FIGS. 7A and 7B, respectively) shows no effect on the CNT-Cu composite after compressive stress. This approach assumes that most CNTs are bent or buckled to give maximum contact under low pressure (no more than 20 psi in IC packaging), which pressure can be achieved by suitable choice of length and diameter of exposed portions of the CNTs The thermal resistance at the interface can be further reduced by optimizing the invented interface materials and packaging technology. More particularly, the contact area at low loading pressure (less than 20 psi) can be increased by optimizing the length of the exposed CNTs (which results in lower buckling and bending force). The thermal conductivity of Cu filled in interstitial space can be also increased by improving the integrity of the Cu material. With such optimization implemented, the thermal resistance is expected to be reduced below 0.1 cm$^2$K/Watt which is even better than eutectic binding used today, and can be efficiently used for heat dissipation over 100 Watts/cm$^2$ for future IC chips.

These preliminary results demonstrate the fundamental usefulness of CNTs and CNT-Cu composite films as efficient heat conductors. Our analysis confirms that these novel thermal conductivity layers can accomplish effective heat conduction by increasing contact area. In addition, the CNTs provide the added benefits of high mechanical stability and reusability.

What is claimed is:

1. A method for providing for transport of thermal energy from an object, the method comprising:
   providing an array of carbon nanotubes or carbon nanofibers, referred to herein as "CNTs," embedded in or connected to a selected surface of a selected substrate having high thermal conductivity, where at least first and second CNTs in the array are adjacent to and are oriented substantially perpendicular to the selected surface;
   after provision of the at least first and second CNTs in the array, filling at least a portion of an interstitial space between the at least first and second adjacent CNTs in the array with a selected filler material that has high thermal conductivity so that the filler material makes contact with the selected substrate surface at a first end of each of the at least first and second CNTs and a second end of each of the at least first and second CNTs is exposed and is not fully covered by the filler material;
   applying at least one of (i) polyethylene glycol and (ii) Janus Green B to exposed ends of each of the at least first and second CNTs to inhibit deposition of the filler material at one or more of the exposed ends; and
   causing the exposed second ends of the at least first and second CNTs to make contact with a surface of an object for which transport of thermal energy is to be provided so that at least one of the exposed second ends of the CNTs bends or buckles, whereby thermal energy is removed from the object through the at least first and second CNTs and a portion of the removed thermal energy is distributed within the filler material.

2. The method of claim 1, further comprising selecting said filler material to include at least one of Cu, Ag, Au, Pt, Pd and a metal-doped silicide.

3. The method of claim 1, further comprising providing a layer of a selected catalyst, including at least one of Ni, Fe, Co, Pt and Al, for growth of said array of said CNTs, on said selected surface of said substrate.

4. The method of claim 1, further comprising filling said portion of said interstitial space with said filler material by a process comprising at least one of chemical vapor deposition, physical vapor deposition, plasma deposition, ion sputtering, electrochemical deposition and casting from a liquid phase.

5. The method of claim 1, further comprising providing said exposed second ends of said at least first and second CNTs by a process comprising at least one of mechanical polishing, chemical-mechanical polishing, wet chemical etching, electrochemical etching and dry plasma etching.

6. The method of claim 1, further comprising providing said exposed ends of said first and second CNTs in said array with an exposed first length and an exposed second length, respectively, that are not covered by said filler material, where the exposed first length and the exposed second length are substantially equal.

7. The method of claim 1, further comprising providing said exposed ends of said first and second CNTs in said array with an exposed first length and an exposed second length, respectively, that are not covered by said filler material, where the exposed first length is greater than the exposed second length.

8. The method of claim 1, further comprising providing for said transport of said thermal energy from said object with an associated thermal resistance of no more than about 8 cm$^2$-K/Watt.

9. The method of claim 1, further comprising providing for said transport of said thermal energy from said object with an associated thermal resistance of no more than about 0.1 cm$^2$-K/Watt.

10. The method of claim 1, further comprising removing said thermal energy from said object initially through said exposed second ends of said at least first and second CNTs in contact with said object, and subsequently through said filler material that makes contact with said at least first and second CNTs.

11. The method of claim 1, further comprising removing said thermal energy from said object contemporaneously through said exposed second ends of said at least first and second CNTs in contact with said object and through said filler material that makes contact with said at least first and second CNTs.

12. The method of claim 1, further comprising providing said object with a surface for said contact that is rough on an atomic scale and is not substantially planar.

13. A method for providing for transport of thermal energy from an object, the method comprising:

providing an array of carbon nanotubes or carbon nanofibers, referred to herein as "CNTs," embedded in or connected to a selected surface of a selected substrate having high thermal conductivity, where at least first and second CNTs in the array are adjacent to and are oriented substantially perpendicular to the selected surface;

attaching a heat sink mechanism to the substrate to receive heat from the substrate and to radiate at least a portion of the received heat to an ambient atmosphere;

after provision of the at least first and second CNTs in the array, filling at least a portion of an interstitial space between the at least first and second CNTs in the array with a selected filler material that has high thermal conductivity so that the filler material makes contact with the selected substrate surface at a first end of each of the at least first and second CNTs and a second end of each of the at least first and second CNTs is exposed and is not fully covered by the filler material; and causing the exposed second ends of the at least first and second CNTs to make contact with a surface of an object for which transport of thermal energy is to be provided so that at least one of the exposed second ends of the CNTs bends or buckles, whereby thermal energy is removed from the object through the at least first and second CNTs and a portion of the removed thermal energy is distributed within the filler material.

* * * * *